US012696396B2

(12) United States Patent
Zhang et al.

(10) Patent No.: US 12,696,396 B2
(45) Date of Patent: Jul. 28, 2026

(54) REAL-TIME CONTROL OF VIA STUB DRILLING DEPTH ASYMMETRY

(71) Applicant: International Business Machines Corporation, Armonk, NY (US)

(72) Inventors: Yanyan Zhang, Austin, TX (US); Mahesh Bohra, Austin, TX (US); Wiren Dale Becker, Hyde Park, NY (US); Nam Huu Pham, Round Rock, TX (US); Pavel Roy Paladhi, Pflugerville, TX (US); Daniel Mark Dreps, Georgetown, TX (US); Lloyd Andre Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 587 days.

(21) Appl. No.: 17/854,766

(22) Filed: Jun. 30, 2022

(65) Prior Publication Data

US 2024/0008186 A1 Jan. 4, 2024

(51) Int. Cl.
| | |
|---|---|
| *H05K 3/00* | (2006.01) |
| *H05K 3/42* | (2006.01) |
| *H05K 1/11* | (2006.01) |

(52) U.S. Cl.
CPC ........... *H05K 3/0047* (2013.01); *H05K 3/429* (2013.01); *H05K 1/115* (2013.01); *H05K 2203/0207* (2013.01)

(58) Field of Classification Search
CPC ...... H05K 3/0047; H05K 3/429; H05K 1/115; H05K 2203/0207; H05K 2203/163
See application file for complete search history.

(56) References Cited

U.S. PATENT DOCUMENTS

| | | | | | |
|---|---|---|---|---|---|
| 4,280,775 | A | * | 7/1981 | Wood | B23Q 1/36 408/69 |
| 4,765,784 | A | * | 8/1988 | Karwan | H05K 3/0047 408/13 |
| 4,790,694 | A | * | 12/1988 | Wilent | H05K 3/4638 408/1 R |

(Continued)

OTHER PUBLICATIONS

Cedeño-Chaves, J., Scharff, K., Carmona-Cruz, A., Bruns, H. D., Rimolo-Donadio, R., & Schuster, C. (2019, June). Mode Conversion Due To Residual Via Stubs in Differential Signaling. In 2019 IEEE 23rd Workshop on Signal and Power Integrity (SPI) (pp. 1-4). IEEE.

(Continued)

*Primary Examiner* — Jeffrey T Carley
(74) *Attorney, Agent, or Firm* — Harrity & Harrity, LLP

(57) ABSTRACT

A gang drilling machine for drilling a circuit card includes a pair of n and p master drills that are configured to be aligned in registry with respective n and p test vias of the card; pluralities of n and p minion drills that are configured to be aligned in registry with pluralities of n and p live vias of the card; and a controller that is electrically connected to control the n and p master drills and minion drills, and to send and receive electrical signals to and from the card. The controller is configured to: send a query signal to the card; monitor a response signal from the card; determine drilling depth of at least one of the master drills, in response to comparing the response signal to the query signal; and adjust operation of the machine, in response to the determined drilling depth.

13 Claims, 10 Drawing Sheets

(56)                References Cited

U.S. PATENT DOCUMENTS

| | | | | |
|---|---|---|---|---|
| 7,448,880 | B2 | 11/2008 | Osaka | |
| 7,669,321 | B1 * | 3/2010 | Levy | H05K 1/0268 |
| | | | | 29/402.06 |
| 9,459,285 | B2 * | 10/2016 | Ma | G01R 1/06755 |
| 9,655,251 | B2 * | 5/2017 | Araki | H05K 3/0047 |
| 2009/0049414 | A1 | 2/2009 | Mutnury | |
| 2011/0100699 | A1 * | 5/2011 | Hamazaki | H05K 3/0047 |
| | | | | 174/266 |
| 2014/0093321 | A1 * | 4/2014 | Liu | B23B 41/14 |
| | | | | 408/1 R |
| 2015/0245494 | A1 * | 8/2015 | Araki | H05K 3/0047 |
| | | | | 408/1 R |
| 2015/0342057 | A1 * | 11/2015 | Bartley | H05K 3/429 |
| | | | | 408/2 |
| 2015/0359110 | A1 * | 12/2015 | Wright | H05K 3/0047 |
| | | | | 29/593 |
| 2023/0156928 | A1 * | 5/2023 | Wilkinson | H05K 3/22 |
| | | | | 174/266 |

OTHER PUBLICATIONS

Ji, J. (Mar. 2008). Investigation of Skew on Differential High Speed Links. University of GÄVLE Master's thesis in Electronic Engineering. pp. 1-61.

Kim, D. Y., Byun, J., Lee, S. H., Oh, S. J., Kang, K. S., & Lee, H. Y. (Feb. 2011). Signal Integrity Improvements of a MEMS probe Card Using Back-Drilling and Equalizing Techniques. IEEE Transactions on Instrumentation and Measurement, 60(3), 872-879. Full text was not available.

Kunz, E., Choi, J. Y., Kunda, V., Kocubinski, L., Li, Y., Miller, J., . . . & Novak, I. (Jan. 2014). Sources and Compensation of Skew in Single-Ended and Differential Interconnects. In DesignCon.

Scharff, K., Reuschel, T., Duan, X., Briins, H. D., & Schuster, C. (2017, May). Exploration of differential via stub effect mitigation by using PAM4 and PAM8 line coding. In 2017 IEEE 21st Workshop on Signal and Power Integrity (SPI) (pp. 1-4). IEEE. Full text was not available.

Zhang, Y, et al. "Signal Integrity Characterization of Channels with Asymmetric Via Stubs" IEEE Electrical Performacne of Electrical Packaging (Aug. 2020). pp. 1-3.

Baek S, Lee E, Sung B. Computation of intra-pair skew for imbalance differential line using modified mixed-mode S-parameter. In 2007 IEEE Electrical Performance of Electronic Packaging Oct. 29, 2007 (pp. 179-182). IEEE.

Cedeño-Chaves, J., Scharff, K., Carmona-Cruz, A., Bruns, H.D., Rimolo-Donadio, R. and Schuster, C., Jun. 2019. Mode Conversion Due to Residual Via Stubs in Differential Signaling. In 2019 IEEE 23rd Workshop on Signal and Power Integrity (SPI) (pp. 1-4). IEEE.

Shiue, G.H., Yeh, C.L., Liu, L.S., Wei, H. and Ku, W.C., Oct. 2014. Influence and mitigation of longest differential via stubs on transmission waveform and eye diagram in a thick multilayered PCB. IEEE Transactions on Components, Packaging and Manufacturing Technology, 4(10), pp. 1657-1670.

OKI Circuit Technology Co.,Ltd, Jun. 2022, Ultra high speed and high frequency transmission PCB. https://www.oki-btc.jp/en/products/high_speed.html (accessed Jun. 30, 2022). pp. 1-6.

Benjamin Dannan, "Signal Integrity Characterization of Via Stubs on High-Speed DDR4 Channels", https://www. signalintegrityjournal. com/articles/1731-signal-integrity-characterization-of-via-stubs-on-high-speed-ddr4-channels, Jun. 2, 2020, 12 pages.

* cited by examiner

600

602

Drill each super coupon on card depth

604

Measure each super coupon with VNA

606

Determine the stub lengths and delta on each leg of the diff pair (use pre-generated lookup table)

608

Use data from coupons as a calibration reference to determine the drill depth in sector of the board.

610

Complete back drilling on entire card using the corrected layer depth in each sector $$Dt = t_p - t_n = \frac{lp}{v_{p1}} - \frac{ln}{v_{p2}} \qquad (1)$$

$$K_1 = \left\{ \frac{(S^2_{1d1} - S^2_{3d1} + 1)^2 - (2S_{1d1})^2}{(2S_{3d1})^2} \right\}^{1/2} \qquad (2a)$$

$$e^{-\gamma_1 l} = \left\{ \frac{1 - S^2_{1d1} + S^2_{3d1}}{2S_{3d1}} \pm K_1 \right\}^{-1}$$

$$v_{p1} = \frac{\omega}{\beta_1 (\beta_1 = Imaginary(\gamma_1))}$$

$$K_2 = \left\{ \frac{(S^2_{1d1} - S^2_{4d1} + 1)^2 - (2S_{2d1})^2}{(2S_{4d1})^2} \right\}^{1/2} \qquad (2b)$$

$$e^{-\gamma_2 l} = \left\{ \frac{1 - S^2_{2d1} + S^2_{4d1}}{2S_{4d1}} \pm K_2 \right\}^{-1}$$

$$v_{p2} = \frac{\omega}{\beta_2 (\beta_2 = Imaginary(\gamma_2))}$$

| PN Skew (ps) | Equa.1 Db (mil) | Equa.2 Db (mil) |
|---|---|---|
| -3 | 25.0845 | 25.5516 |
| -2.5 | 20.90725 | 21.28905 |
| -2 | 16.73 | 17.0265 |
| -1.5 | 12.55275 | 12.76395 |
| -1 | 8.3755 | 8.5014 |
| -0.5 | 4.19825 | 4.23885 |
| 0 | 0.021 | -0.0237 |
| 0.5 | -4.15625 | -4.28625 |
| 1 | -8.3335 | -8.5488 |
| 1.5 | -12.5108 | -12.8114 |
| 2 | -16.688 | -17.0739 |
| 2.5 | -20.8653 | -21.3365 |
| 3 | -25.0425 | -25.599 |

*FIG. 8*

REAL-TIME CONTROL OF VIA STUB DRILLING DEPTH ASYMMETRY

BACKGROUND

The present invention relates to the electrical, electronic, and computer arts, and more specifically, to fabricating integrated circuit cards.

Integrated circuit cards are laminated structures that comprise multiple layers, of which the conductive layers sometimes are referred to as "planes." When fabricating an integrated circuit card, vias are drilled through the card and then plated with metal to electrically interconnect different conductive layers or planes within the laminated structure of the card. At this step, all of the vias extend all of the way through the card, and interconnect all of the signal traces in multiple planes that touch the vias. To electrically separate signal traces that should not be connected, the unwanted portions of the vias that are going beyond the connected signal planes in the plated through-hole vias are drilled back from either or both sides of the cards. Many vias may be drilled to the same depths, or some vias may be drilled to different depths. Drilling a via typically leaves a "stub" that protrudes beyond the target layer that the via electrically connects to. Stubs are not desirable and typically need to be removed as much as possible. When differentially paired vias, i.e., "n" and "p" vias, are drilled to different depths or stub lengths, the different electrical properties of the "n" and "p" stubs can produce electromagnetic interference (EMI) that detracts from circuit card performance.

In future systems, a 64 Gbps data rate (or beyond) and a throughput rate greater than 100 Gbps in a data link will be featured. Hybrid cloud computing systems are pushing data rates higher and higher. Asymmetry or imbalance in the differential signal routing significantly degrades the signal integrity of multi-gigabit interconnects. A plated-through hole via has a current carrying part from its surface connection to an internal wiring layer. The portion of the via after the internal wiring layer is removed, typically by a back-drilling process that leaves a residual via stub. The via stub lengths are greater than zero due to tolerances in PCB fabrication, with a typical tolerance of +/−10 mils (1 mil=one thousandth of an inch=0.0254 mm) around a so-called do-not-cut line (typically, a minimum stub length of 15 mil). The tolerance value accounts for variations in circuit card surface profile and thickness. Generally, the larger tolerance value, e.g., "+10" deeper than the do-not-cut line, corresponds to a maximum design value of drilling depth. Exceeding the larger tolerance could compromise circuit performance by interrupting contact between a signal trace and the via being drilled. Via stubs are left in place in order to maintain circuit connectivity. The goal of via stub drilling is to reduce the stubs to a minimum necessary length, so as to reduce the electromagnetic interference (EMI) that they produce.

Stub length variation or offsets up to 20 mils can cause a mismatch of the via stub loading on the differential signaling, which impacts the impedance matching and induces a skew in time response between p and n stubs ("PN skew"). Even picosecond skews can impact the performance of the channel and induce undesirable differential-to-common (DTC) mode noise that produces EMI. It has been shown that for a 40 Gbps channel, a PN skew degrades the eye diagram with the jitter doubled as compared with equal-length-residual-stub vias.

Controlling via drilling depth (and the resulting lengths of via stubs that protrude beyond the signal traces) is a recognized technical challenge.

SUMMARY

Principles of the invention provide techniques for real-time control of via stub drilling depth asymmetry.

In one aspect, an exemplary gang drilling machine includes a pair of n and p master drills that are configured to be aligned in registry with a respective n test via and p test via of the circuit card; a plurality of n minion drills and a plurality of p minion drills that are configured to be aligned in registry with pluralities of n live vias and p live vias of the circuit card; and a controller that is electrically connected to control the operations of the n and p master drills and of the associated pluralities of n and p minion drills, and to send and to receive electrical signals to and from the circuit card. The controller is configured to perform a method that includes: sending an electrical query signal to the circuit card; monitoring an electrical response signal from the circuit card; determining a drilling depth of at least one of the master drills, in response to a comparison of the response signal to the query signal; and adjusting operation of the gang drilling machine, in response to the determined drilling depth.

Another aspect provides a method for controlling drilling of a via in a circuit card. The method includes sending an electrical query signal to the circuit card; monitoring an electrical response signal from the circuit card; determining a drilling depth of at least one drill, in response to a comparison of the response signal to the query signal; and adjusting operation of the at least one drill, in response to the determined drilling depth.

Another aspect provides a circuit card, which includes a plurality of signal traces; a first super coupon that includes a first plurality of test coupons, wherein each of the first plurality of test coupons includes a pair of electrically separate n and p reference vias that are plated through-hole vias and a pair of n and p test vias that are electrically connected with the respective n and p reference vias at a first signal layer; and a second super coupon that includes a second plurality of test coupons, wherein each of the second plurality of test coupons includes a pair of electrically separate n and p reference vias that are plated through-hole vias and a pair of n and p test vias that are electrically connected with the respective n and p reference vias at a second signal layer that is deeper in the circuit card by comparison to the first signal layer.

In view of the foregoing, techniques of the present invention can provide substantial beneficial technical effects. For example, one or more embodiments provide one or more of:

Reduction of stub length offsets between adjoining via stubs.

Reduction of PN skew between channels of a circuit card.

In circuit card manufacturing, ability to use a test coupon to understand manufacturing tolerance, potentially allowing larger tolerances validated through actual measurements. This provides a valuable insight on manufacturing tolerances and better confidence in either tightening or relaxing the specifications for large volume card production from vendors.

In circuit card manufacturing, ability to control via back drilling in real-time to reduce differential via stub asymmetry.

Enhanced accuracy of closed loop feedback control for drilling operations in high-speed (>25 Gbps) PCB fabrication as well as characterization and specification for high-speed differential via design.

Ability to assess compliance with design dimensions, using low-frequency measurements (inexpensive in comparison to TDR).

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 5 depicts equations for calculating via stub length offset from time skew, according to exemplary embodiments.

FIG. 8 depicts an exemplary lookup table that relates via stub length offset to time skew for a specific query signal frequency, according to exemplary embodiments.

DETAILED DESCRIPTION

One or more embodiments advantageously provide techniques for real-time control of via stub drilling depth asymmetry.

Time Domain Reflectometry (TDR) is a widely used method for via impedance measurements. High-resolution TDR is pertinent for accurate characterization of small via impedance discontinuity; however, such high-performance TDR is very expensive, and the maintenance cost is also high.

One or more embodiments provide a real-time measurement method and apparatus buildable into a Vector Network Analyzer (VNA) for controlling back-drilling accuracy in reducing the differential via stub asymmetry using measured low-frequency scattering parameters in a few hundred MHz range (<500 MHz). Embodiments provide opportunities to use lower-cost equipment with fast analysis to increase the number of PN skew measurements that can be taken for disposition of printed circuit boards.

As compared with the TDR method, one or more embodiments work in the frequency domain, as a real-time signal processing, yet low-cost, method to monitor PCB fabrication quality and consistency for differential via pairs. Advantageously, one or more embodiments can verify and characterize the imbalance of the differential via stubs in the lab measurement to gain insights and feedback for high-speed differential via design. A test coupon including the differential via with specified via stubs can be added along with other trace test coupons in the same panel to verify the consistency of the via back-drilling process across the whole panel.

Figure 1:
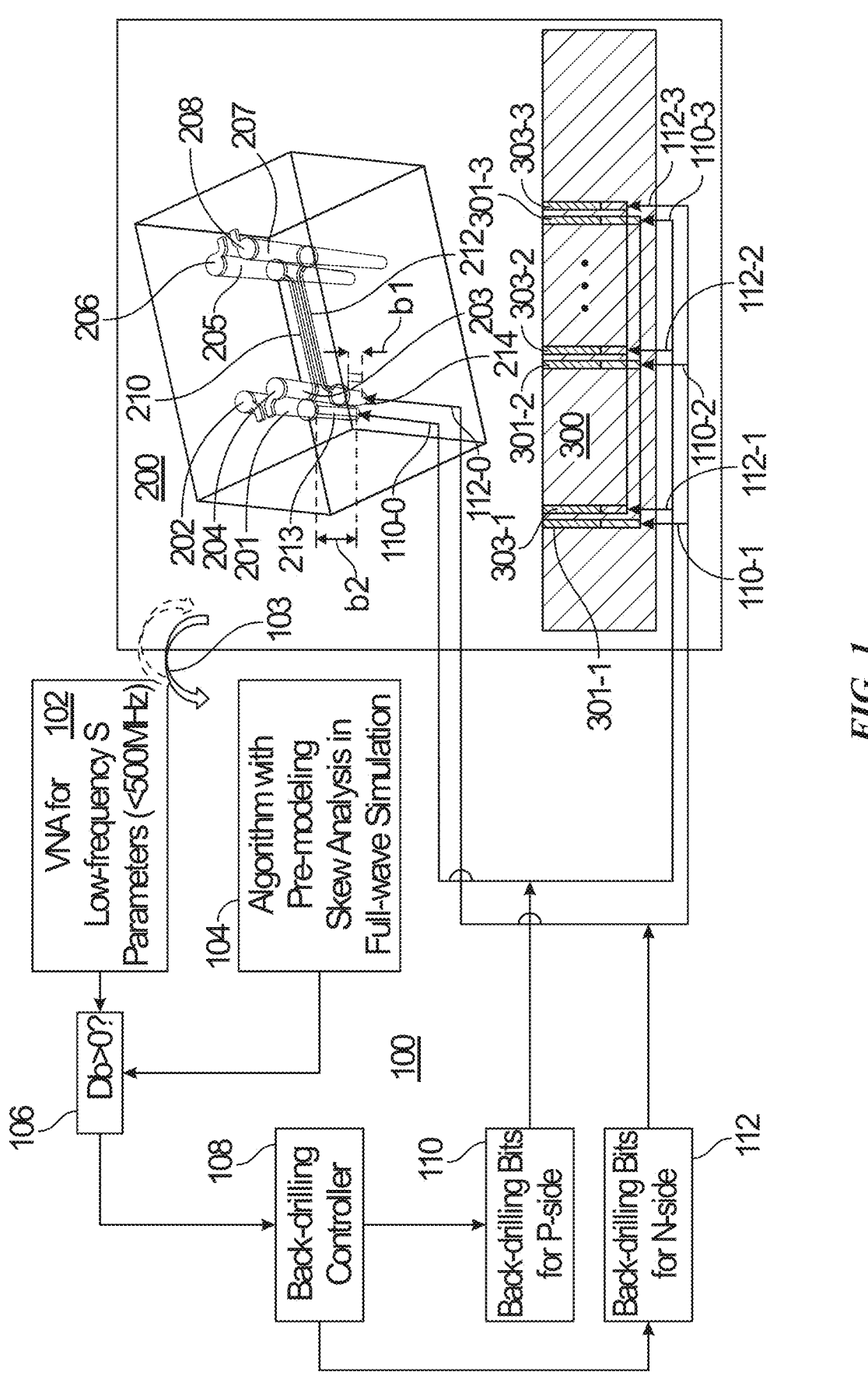
FIG. 1 depicts in a schematic a method and apparatus for real-time control of via stub drilling depth asymmetry using a test coupon in a circuit card, according to exemplary embodiments.

FIG. 1 depicts in a schematic a method and apparatus 100 for real-time control of via stub drilling depth asymmetry using a test coupon 200 in a circuit card 300, according to exemplary embodiments. Referring to FIG. 1, the method 100 for controlling stub via drilling uses electrical measurements on test vias 201, 203 in the test coupon 200 for the purpose of controlling ganged drills 110, 112 that cut vias 301-1, 301-2, 301-3, 303-1, 303-2, 303-3 that are disposed elsewhere in the circuit card 300. Note that the drills 110, 112 are depicted schematically for purposes of illustrative convenience; however, the skilled artisan is familiar with drills and drilling fixtures suitable for drilling out vias. Note also the arrows 112-1, 112-2, 112-3 representing individual drill bits.

The test coupon 200 includes an n test via 201 and a corresponding test port 202, a p test via 203 and a corresponding test port 204, an n reference via 205 and a corresponding test port 206, a p reference via 207 and a corresponding test port 208. The test coupon 200 also includes an n signal trace 210, which electrically connects the n test via 201 to the n reference via 205. The test coupon 200 also includes a p signal trace 212, which electrically connects the p test via 203 to the p reference via 207. The n and p reference vias are full through vias that are plated with conductive material through the thickness of the circuit card 300. The n and p test vias 201, 203 are back-drilled so that they do not extend all the way through the thickness of the circuit card. Thus, the n and p test vias 201, 203 have respective stubs 213, 214.

The method 100 includes several steps. At 102, perform vector network analysis (VNA) of a response signal 103 that is returned from one or more of test ports 202, 204, 206, 208 after applying a query signal to one or more of the test ports. At 104, apply an exemplary algorithm with pre-modeling skew analysis in a full-wave simulation of the response signal. Certain details of the algorithm 104 are explained in FIG. 4 through FIG. 8. Generally, a differential via model of varying stub asymmetry is simulated in a 3D full-wave solver. Skew between p and n vias ("PN skew") is calculated with the simulated scattering parameter ("S-parameter") from the model. A linear equation is extrapolated to describe the via stub asymmetry as a function of PN skew, or a lookup table is defined, based on the equation. The lookup table can be searched to find a value of stub asymmetry given a certain skew number that is calculated from the measured S-parameter from VNA. At 106, determine stub length offset Ab based on the magnitude of a time skew detected by the algorithm at 104; FIG. 4 through FIG. 7, which are further discussed below, provide exemplary information regarding how to do this.

At 108, a back-drilling controller adjusts P-side back-drilling bits 110 and N-side back-drilling bits 112 in response to the determined stub length offset. For example, in case the algorithm at 106 determines that N-side via stubs are longer than P-side via stubs, the back-drilling controller controls the drills to drill deeper on the N-side vias. On the other hand, in case the algorithm at 106 determines that the P-side via stubs are longer than the N-side stubs, the back-drilling controller controls the drills to drill deeper on the P-side vias. In FIG. 1, the N-side vias are shown as 201, 301-1, 301-2, 301-3 while the P-side vias are shown as 203, 303-1, 303-2, 303-3. The respective N-side and P-side drill bits are shown as 110-0, 110-1, 110-2, 110-3 and 112-0, 112-1, 112-2, 112-3. The skilled worker will apprehend that more or fewer drill bits can be included in a gang-drilling machine according to embodiments of the invention.

Figure 2:
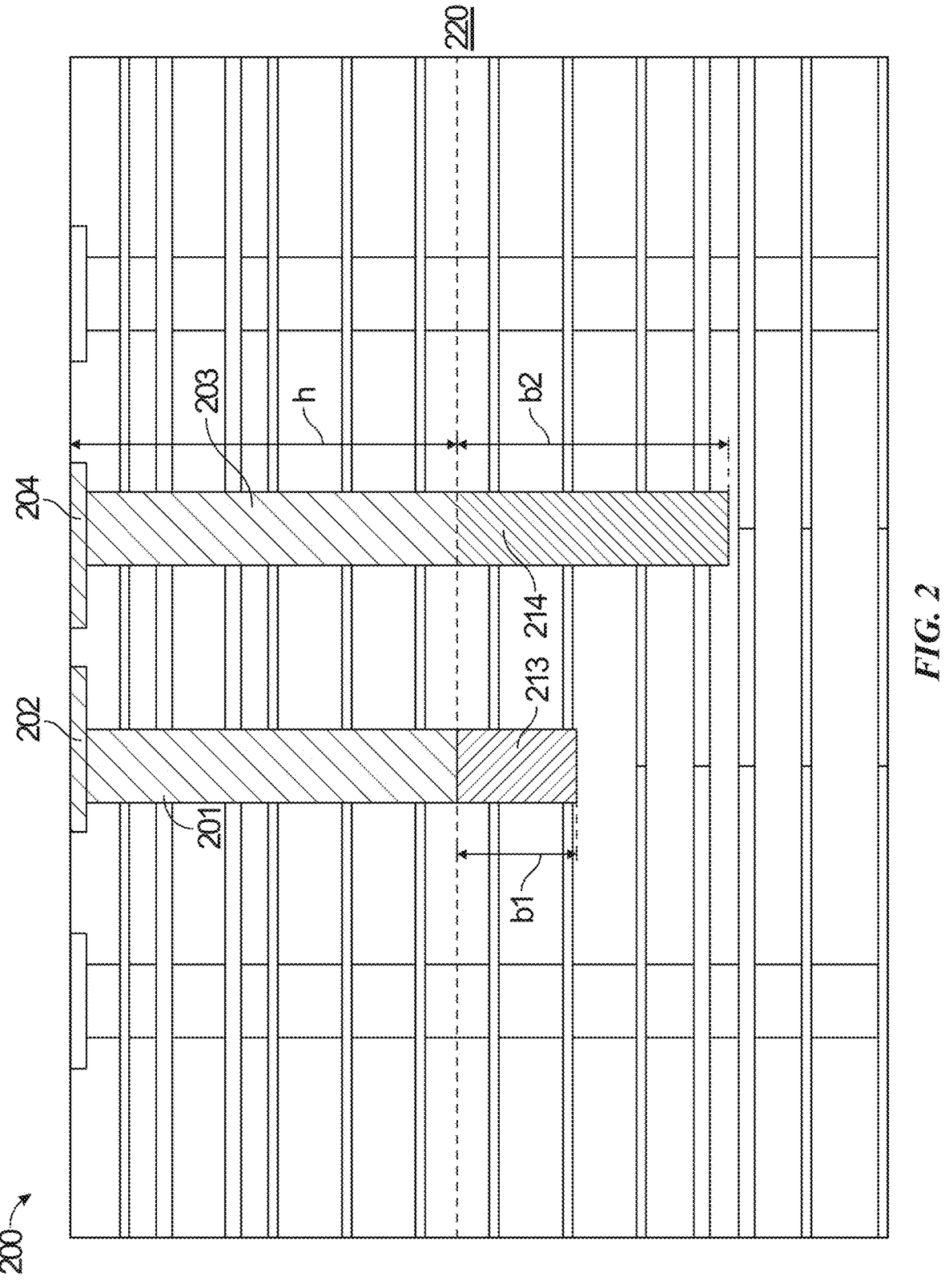
FIG. 2 depicts a side section view of the test coupon that is shown in FIG. 1, according to exemplary embodiments.

FIG. 2 depicts a side section view of the test coupon 200 that is shown in FIG. 1, according to exemplary embodiments. The n via 201 has the n test port 202 at its top end and has the n stub 213 at its bottom end. The n stub 213 protrudes to a distance b1 below a signal plane 220, in which are the signal traces 210 and 212 (shown in FIG. 1). The p via 203 has the p test port 204 at its top end and has the p stub 214 at its bottom end. The p stub 214 protrudes to a distance b2 below the signal plane 220. The difference b2–b1 is equal to Ab. Both vias 201, 203 extend a height h from the top of the card to the signal plane 220.

Figure 3:
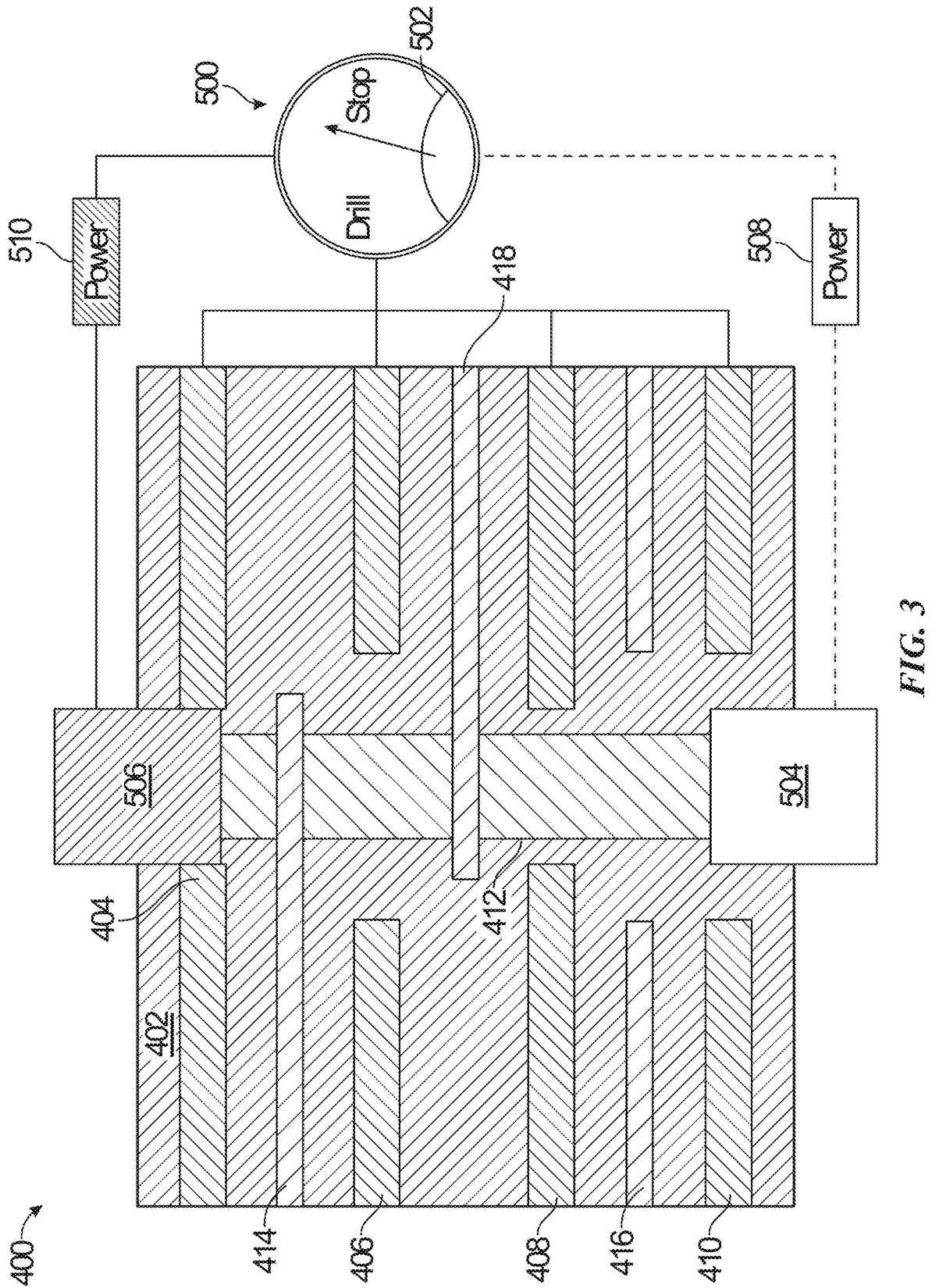
FIG. 3 depicts in a schematic another apparatus for real-time control of via stub drilling depth in a circuit card, according to exemplary embodiments.

FIG. 3 depicts in a schematic another apparatus 500 for real-time control of via stub drilling depth in a circuit card 400, in which a via 412 and various signal traces 414, 416, 418 and power planes are embedded in a circuit card body 402, according to exemplary embodiments. The drill depth control apparatus 500 includes a comparison circuit or comparator 502 that is configured to start or stop drills 504, 506 in response to whether a response signal matches a query signal. Power supplies 508, 510 send respective query signals to the conductive drills 504, 506 and the comparator 502 monitors for response signals on drill stop power planes (reference planes) 404, 408 and power planes 406, 410. In one or more embodiments, inner edges of the drill stop power planes 404, 408 are closer to the via 412 than are inner edges of the other power planes 406, 410. This enables the use of the drill stop power planes to halt drilling before the drill bit contacts one of the signal traces 414, 418. Receiving a response signal indicates that a drill 504 or 506 has reached a reference plane 404 or 408, i.e., the drill bit is at a reference plane depth. When the comparator 502 receives, from the drill stop power plane 404, a response signal that matches the respective query signal from the power supply 510, it stops the drill 506. When the comparator 502 receives, from the drill stop power plane 408, a response signal that matches the respective query signal from the power supply 508, it stops the drill 504. Thus, as shown in FIG. 3, the drill depth control apparatus 500 has the drill 504 running and has already stopped the drill 506. The comparator 502 can be implemented in a signal analyzer that receives both the query signals and the response signals. In a simpler embodiment, the comparator 502 can be implemented as a power transistor or solenoid that actuates to interrupt power to one of the drills 504 or 506 when the comparator receives the respective response signal from the power plane 408 or 404.

Figure 4:
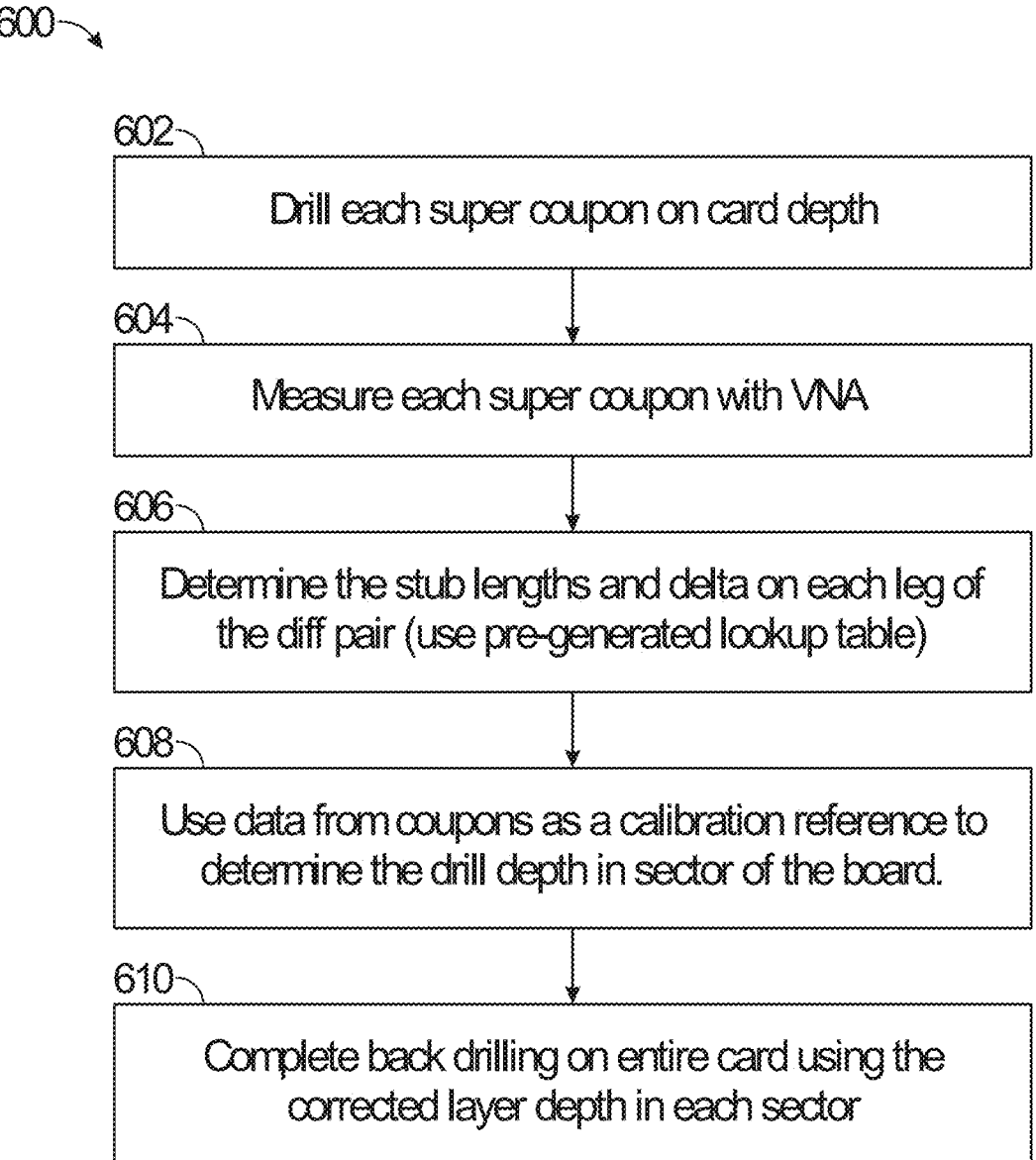
FIG. 4 depicts in a flowchart another method for real-time control of via stub drilling depth, according to exemplary embodiments.

FIG. 4 depicts in a flowchart another method 600 for real-time control of via stub drilling depth, according to exemplary embodiments. The steps of the method 600 also are further explained with reference to FIG. 5 through FIG. 9.

Figure 9:
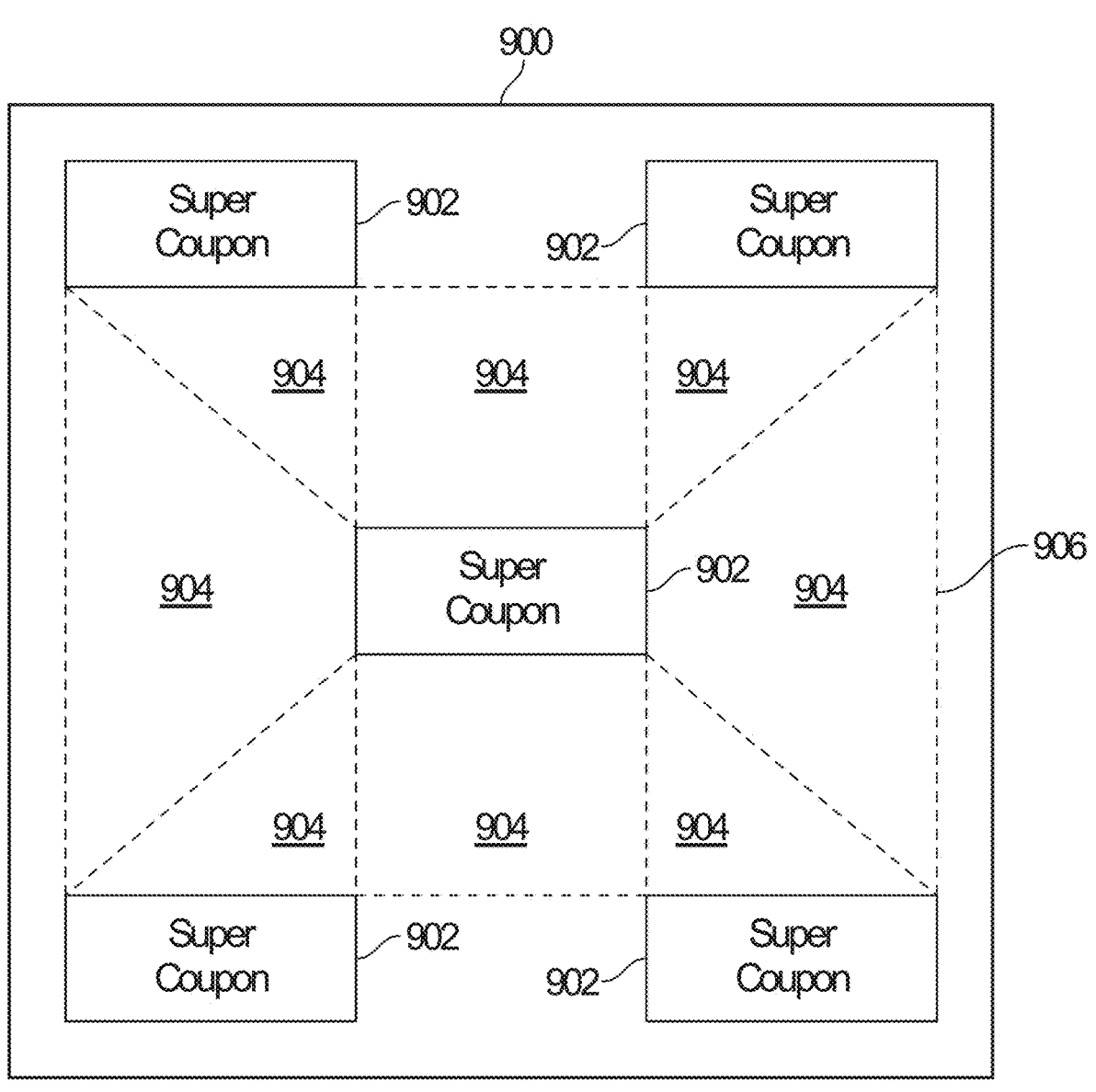
FIG. 9 depicts a circuit card with super coupons, according to exemplary embodiments.

FIG. 9 depicts super coupons 902 that are arranged across a circuit card 900. Each super coupon 902 contains a plurality of the test coupons 200 that are shown in FIG. 1. At 602, drill a super coupon 902 on the card 900. Each test coupon is designed to have the same via depth as the live vias in the card 300, depending on the internal depth of the signal layer 220. In other words, different super coupons each include a plurality of test coupons; the test coupons in a first super coupon go to a first signal layer, whereas test coupons in a second super coupon go to a different second signal layer. Thus, the multiple super coupons enable calibration and control of drilling vias to different signal layers in the circuit card.

At 604, measure electrical responses of each super coupon with a vector network analyzer 102 (shown in apparatus 100, FIG. 1).

At 606, determine stub lengths and stub offsets Ab on each leg of each via pair in each super coupon 902, based on the equations shown in FIG. 5 (further discussed below).

At 608, use data from the super coupons as a calibration reference to determine drill depths in various sectors of the board or circuit card. For example, in one or more embodiments, use linear interpolation between the super coupons to estimate a drilling depth error and a corrected layer depth within sectors 904 of the circuit card. The sectors 904 are bounded by imaginary lines 906 that connect the super coupons 902. Given the teachings of the inventive super coupons 902 and the equations of FIG. 5, the skilled artisan will apprehend various other modes for estimating drilling depth errors and corrected layer depths.

At 610, complete back drilling on the entire card, using the corrected layer depth in each sector 904.

FIG. 5 depicts equations (1), (2a), (2b) for calculating via stub length offset from time skew, according to exemplary embodiments. The equations are used for calculation of PN skew with a modified mixed-mode S-parameter. Either the simulated S-parameter from the model simulation or the measured S-parameter from the VNA can be used in the equations to calculate the simulated PN skew or the measured PN skew, respectively.

In solving the equations of FIG. 5, first proceed from top to bottom of equation groups (2a) and (2b), then plug the calculated phase velocities $v_{p1}$ and $v_{p2}$ into equation (1). In equation (1) of FIG. 5, a time skew Dt is equal to the difference in response times $t_p$ and $t_n$, i.e., the difference of stub lengths lp and ln divided by the phase velocities $v_{p1}$ and $v_{p2}$. In equations 2(a) and 2(b), each variable $S_{idj}$ expresses a relation (difference between flight times) between differential-mode incident electromagnetic waves (signal pulses) and reflected waves at a particular pair of ports, where subscript i represents a single-ended port number and subscript j represents a differential-mode or common-mode port number. The K values are calculated from the $S_{idj}$ values in a straightforward manner in the first line of the equation groups, then $\gamma_1$ and $\gamma_2$ are derived from the exponential equations in the second line of the equation groups. $\gamma_1$ and $\gamma_2$ represent propagation constants for the p-side trace and n-side trace, respectively. In the third line of equations, where the phase velocities $v_{p1}$ and $v_{p2}$ are found, co represents angular frequency of the electromagnetic signal applied to the vias. $\beta_1$ and $\beta_2$ are the imaginary components of $\gamma_1$ and $\gamma_2$, respectively.

Figure 6:
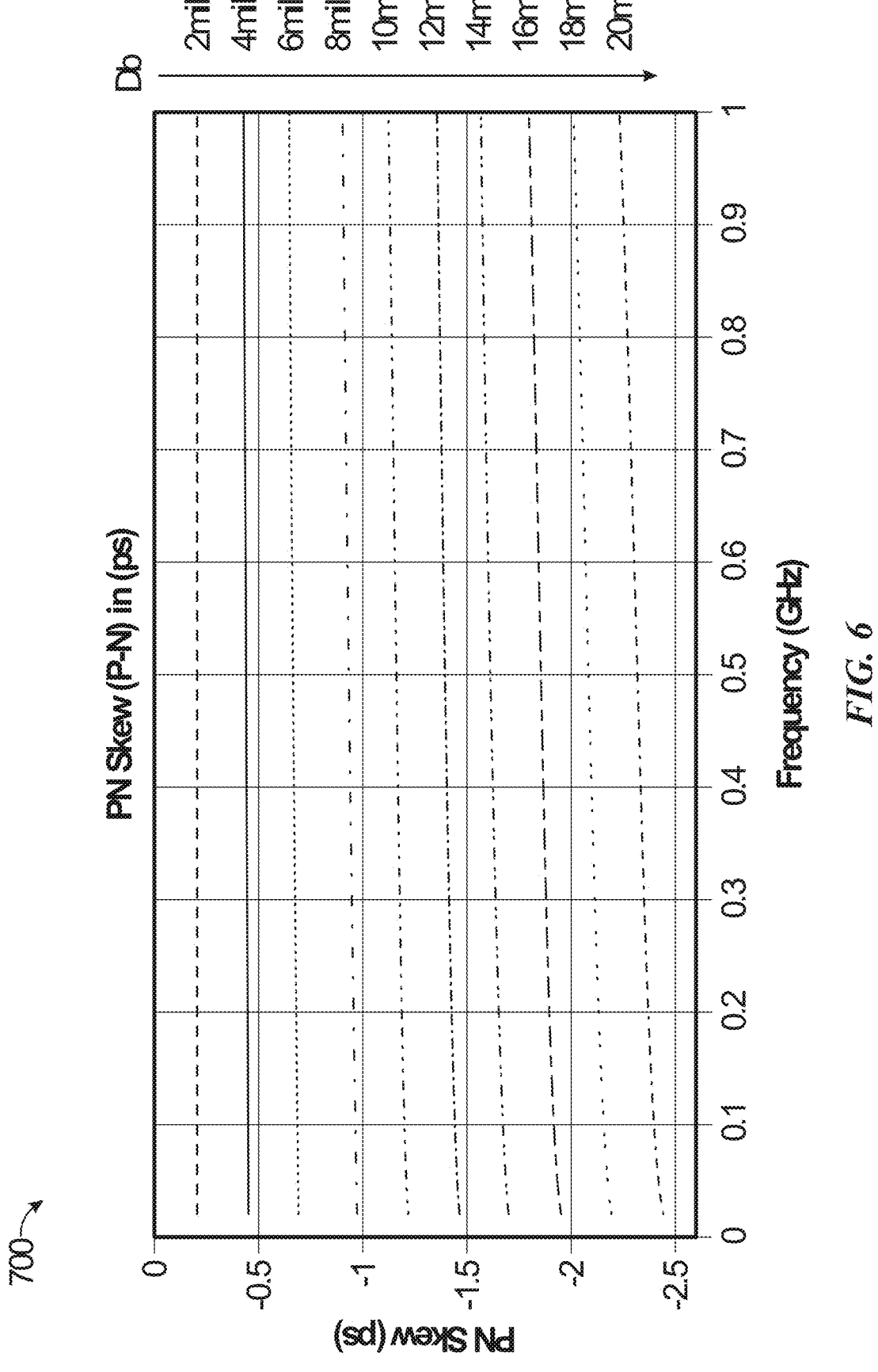
FIG. 6 depicts a graph that relates via stub length offset to time skew across a range of query signal frequencies, according to exemplary embodiments.

FIG. 6 depicts a graph 700 of experimental data, which relates via stub length offset to time skew across a range of query signal frequencies, according to exemplary embodiments.

Figure 7:
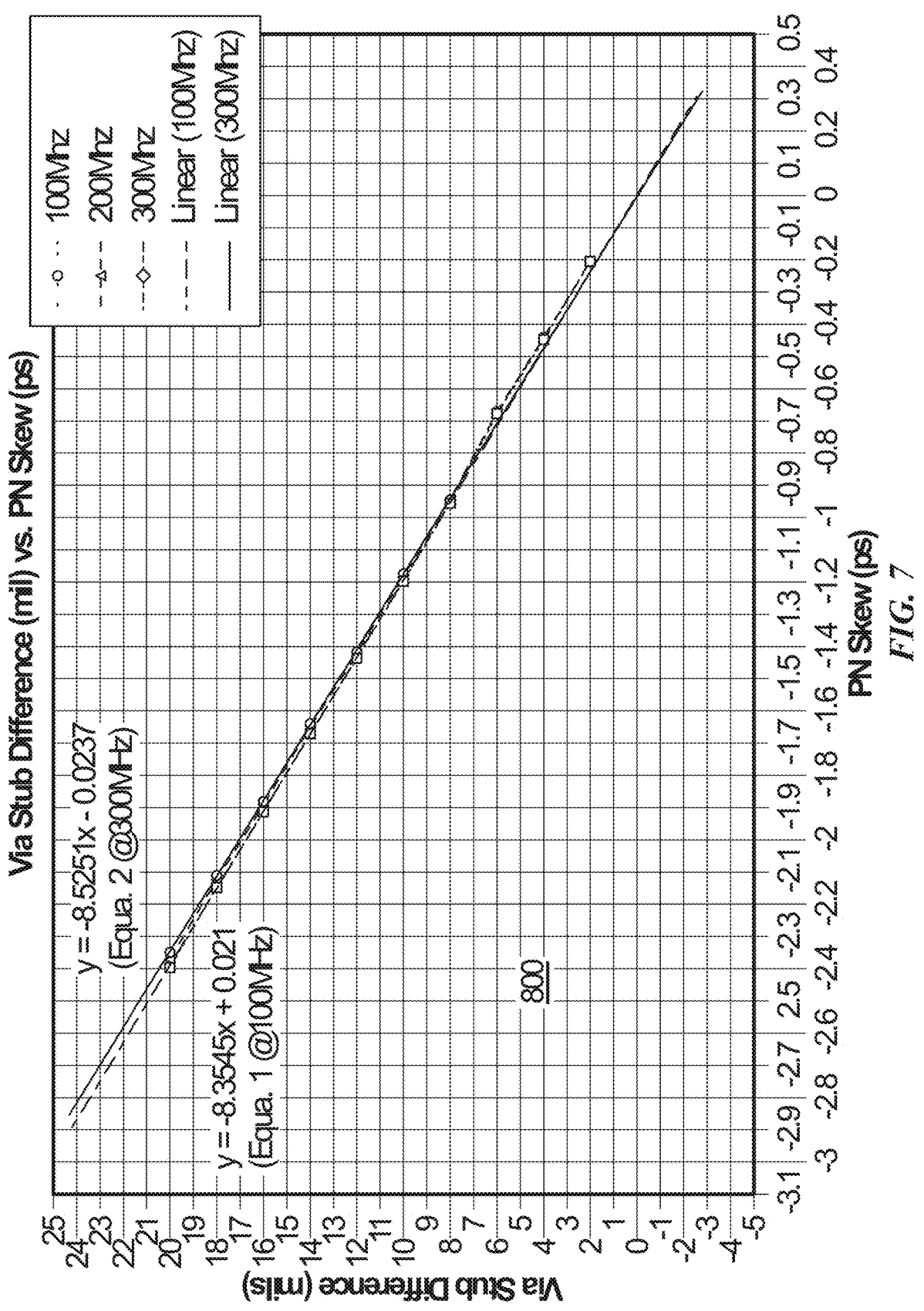
FIG. 7 depicts another graph that relates via stub length offset to time skew across a range of query signal frequencies, according to exemplary embodiments.

FIG. 7 depicts another graph 800 of experimental data, which relates via stub length offset to time skew across a range of query signal frequencies, according to exemplary embodiments.

FIG. 8 depicts an exemplary lookup table 900 that relates via stub length offset to time skew for a specific query signal frequency, according to exemplary embodiments. In one or more embodiments, at 108 (shown in FIG. 1), the back-drilling controller 10 (shown in FIG. 10) uses the lookup table 900 to determine stub length offset from electrical response time skew. The lookup table 900 is based on experimental data points that are picked from the graphs shown in FIG. 6 and FIG. 7. Given the teachings herein, the skilled artisan will be able to use data such as in FIGS. 6 and 7 and prepare a lookup table such as in FIG. 8 to implement one or more embodiments applicable in a variety of conditions.

Figure 10:
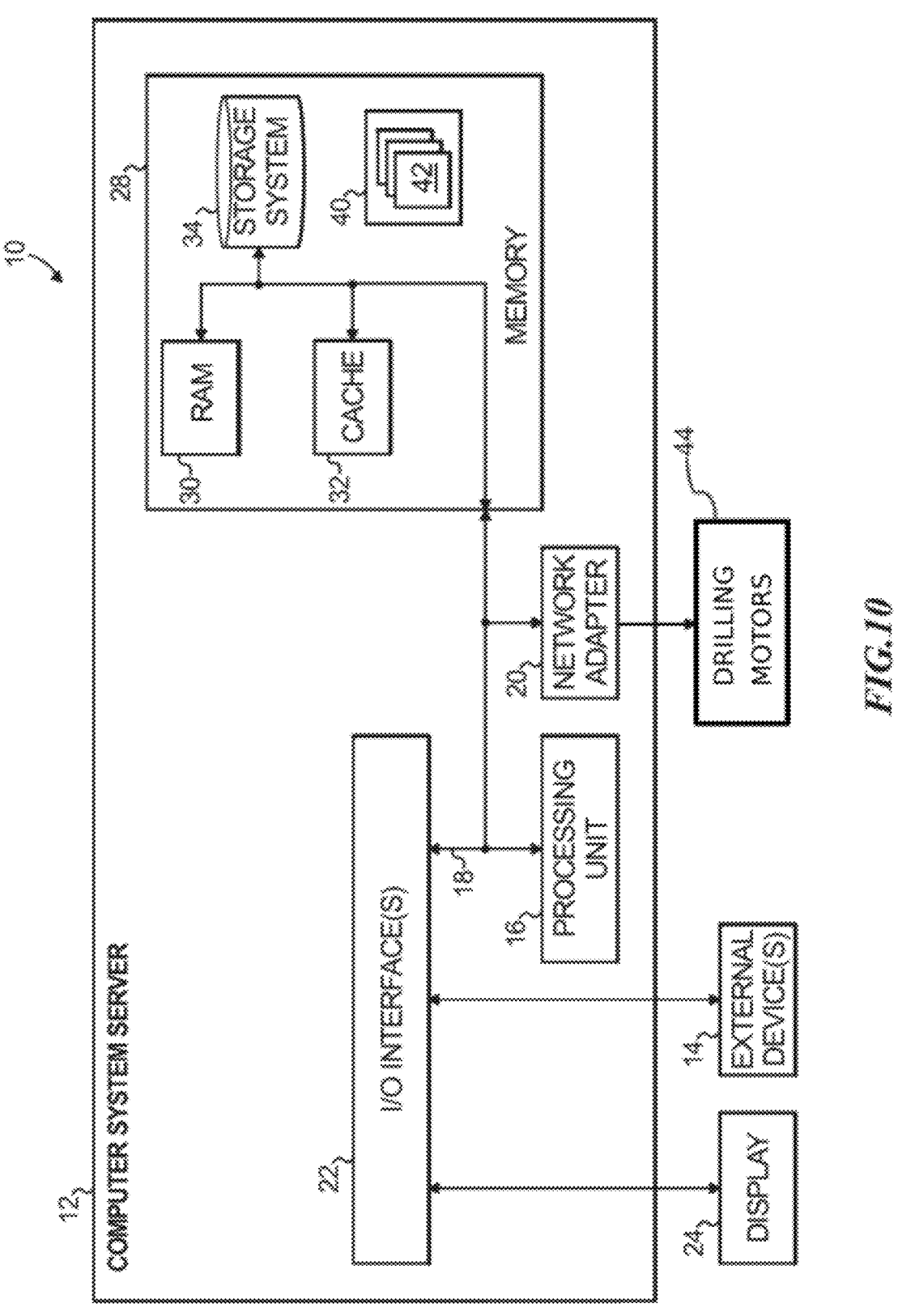
FIG. 10 depicts in a schematic an embodiment of a back-drilling controller of the apparatus shown in FIG. 1, according to exemplary embodiments.

FIG. 10 depicts an embodiment of a back-drilling controller 10 of the apparatus 100 that is shown in FIG. 1 implemented, for example, via software on a general-purpose computer. Embodiments of the back-drilling controller 10 also are usable in the apparatus 500 that is shown in FIG. 3, for implementing a comparator, etc. The back-drilling controller 10 can be implemented in the form of an apparatus that includes a memory and at least one processor that is coupled to the memory and operative to facilitate exemplary method steps, or in the form of a non-transitory computer readable medium embodying computer executable instructions which when executed by a computer cause the computer to facilitate exemplary method steps. Referring now to FIG. 10, controller 10 is only one example of a suitable controller and is not intended to suggest any limitation as to the scope of use or functionality of embodiments of the invention described herein. Regardless, controller 10 is capable of being implemented and/or performing any of the functionality set forth hereinabove.

In controller 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in controller 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or via network adapter 20 (e.g., network card, modem, etc.) with one or more other computing devices 44 (e.g., an industrial system controller). Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 10, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 10) running a server program. It will be understood that such a physical server may or may not include a display and keyboard. Also, note that the apparatus 100 can be controlled, for example, via interface(s) 22 and/or network adapter 20.

Given the discussion thus far, it will be appreciated that, in general terms, embodiments of the invention provide a real-time measurement method and apparatus for via backdrilling, which reduces differential via stub asymmetry (stub length offset) by taking advantage of low-frequency S parameters (<500 MHz) in the frequency domain. As compared to widely-used yet expensive TDR measurement method, this low-cost and accurate testing apparatus provides accurate feedback for proper PCB design and fabrication control to avoid or minimize stub length differences between plated through hole (PTH) vias in a differential pair for high-speed channels (>25 Gbps). The proposed characterization steps in this method also are useful in building high-speed via design/test specifications.

Thus, an exemplary gang drilling machine 100, according to an aspect of the invention, includes a pair of n and p master drills 110-0, 112-0 that are configured to be aligned in registry with a respective n test via 201 and p test via 203 of the circuit card 200. The gang drilling machine 100 also includes a plurality of n minion drills 110-1, 110-2, 110-3, and a plurality of p minion drills 112-1, 112-2, 112-3 that are configured to be aligned in registry with pluralities of n live vias 301-1, 301-2, 301-3 and p live vias 303-1, 303-2, 303-3 of the circuit card; and a controller 10 that is electrically connected to control the operations of the n and p master drills and of the associated pluralities of n and p minion drills, and to send and to receive electrical signals to and from the circuit card. In one or more embodiments, the controller 10 is configured to perform a method 600 that includes: at 102, 604, sending an electrical query signal to the circuit card; at 104, 604, monitoring an electrical response signal 103 from the circuit card; at 106, 608, determining a drilling depth of at least one of the master drills, in response to a comparison of the response signal to the query signal; and at 108, 610, adjusting operation of the gang drilling machine, in response to the determined drilling depth.

In one or more embodiments, in the method that the controller is configured to perform, sending the electrical query signal includes sending an n query signal to the n test via and sending a p query signal to the p test via; monitoring the electrical response signal includes monitoring an n response signal from the n test via and monitoring a p response signal from the p test via; determining the drilling depth includes: measuring a stub length time skew between the n response signal and the p response signal, and determining a stub length offset between the n test via and the p test via, in response to the stub length time skew; and adjusting operation of the gang drilling machine includes increasing the drilling depth of one of the master drills and of the respective plurality of the minion drills, in response to the stub length offset.

In one or more embodiments, the method that the controller is configured to perform further incudes increasing the drilling depth of the n master drill and of the plurality of n minion drills, in response to the stub length offset indicating that the n test via is longer than the p test via. In one or more embodiments, the method that the controller is configured to perform further includes increasing the drilling depth of the p master drill and of the plurality of p minion drills, in response to the stub length offset indicating that the p test via is longer than the n test via. In one or more embodiments, the method that the controller is configured to perform further includes increasing the drilling depth up to a maximum design value.

In one or more embodiments, the gang drilling machine also includes the circuit card. In one or more embodiments, the circuit card includes a test coupon portion of the circuit card and a live portion of the circuit card. The test portion includes the n test via; the p test via; and n and p test ports that are electrically connected to the respective n and p test vias. The live portion includes the plurality of live n vias and the plurality of live p vias.

In one or more embodiments, the test coupon portion includes a first test coupon portion, and the circuit card includes a second test coupon portion that is laterally offset from the first test coupon portion, and the live portion is disposed laterally between the first test coupon portion and the second test coupon portion.

In one or more embodiments, in the method that the controller is configured to perform, adjusting operation of the gang drilling machine includes stopping the at least one of the master drills and the minion drills, in response to the determined drilling depth matching a reference plane depth. In one or more embodiments, determining a drilling depth includes determining that the drilling depth matches the reference plane depth based on the response signal matching the query signal.

In one or more embodiments, in the method that the controller is configured to perform, adjusting operation of the gang drilling machine includes increasing a drilling depth of at least one of the master drills and of the respective plurality of minion drills, in response to the determined drilling depth being less than a reference plane depth. In one or more embodiments, determining a drilling depth includes determining that the drilling depth is less than the reference plane depth based on the response signal not matching the query signal.

Another aspect of the invention provides a method 600 for controlling drilling of a via in a circuit card, and the exemplary method includes, at 102, 604, sending an electrical query signal to the circuit card; at 104, 604, monitoring an electrical response signal from the circuit card; at 106, 608, determining a drilling depth of at least one drill, in response to a comparison of the response signal to the query signal; and, at 108, 610, adjusting operation of the at least one drill, in response to the determined drilling depth.

In one or more embodiments, sending the electrical query signal includes sending an n query signal to the n test via and sending a p query signal to the p test via; monitoring the electrical response signal includes monitoring an n response signal from the n test via and monitoring a p response signal from the p test via; determining the drilling depth includes measuring a stub length time skew between the n response signal and the p response signal, and determining a stub length offset between the n test via and the p test via, in response to the stub length time skew; and adjusting operation of the at least one drill includes increasing the drilling depth of one of the master drills and of the respective plurality of the minion drills, in response to the stub length offset.

In one or more embodiments, increasing the drilling depth includes: increasing the drilling depth of the n drill, in response to the stub length offset indicating that the n test via is longer than the p test via. In one or more embodiments, increasing the drilling depth includes: increasing the drilling depth of the p drill, in response to the stub length offset indicating that the p test via is longer than the n test via.

In one or more embodiments, adjusting operation of the at least one drill includes stopping the at least one drill, in response to the determined drilling depth matching a reference plane depth, and detecting that the determined drilling depth matches the reference plane depth includes detecting that the response signal matches the query signal.

Another aspect provides a circuit card, which includes a plurality of signal traces; a first super coupon that includes a first plurality of test coupons, wherein each of the first plurality of test coupons includes a pair of electrically separate n and p reference vias that are plated through-hole vias and a pair of n and p test vias that are electrically connected with the respective n and p reference vias at a first signal layer; and a second super coupon that includes a second plurality of test coupons, wherein each of the second plurality of test coupons includes a pair of electrically separate n and p reference vias that are plated through-hole vias and a pair of n and p test vias that are electrically connected with the respective n and p reference vias at a second signal layer that is deeper in the circuit card by comparison to the first signal layer. In one or more embodiments, the n and p test vias include via stubs that protrude beyond the respective signal layers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A gang drilling machine for drilling a circuit card, the machine comprising:

an n master drill and a p master drill forming a pair configured to be aligned in registry with a respective n test via and p test via of the circuit card;

the n master drill associated with a plurality of n minion drills and the p master drill associated with a plurality of p minion drills, the plurality of n minion drills and the plurality of p minion drills configured to be aligned in registry with a respective plurality of n live vias and a respective plurality of p live vias of the circuit card; and a controller that is electrically connected to control operations of the n master drill, the p master drill, and the associated pluralities of n and p minion drills, transmits and receives electrical signals from the circuit card, wherein the controller is configured to:

send an electrical query signal to the circuit card, wherein sending the electrical query signal comprises sending an n query signal to the n test via and sending a p query signal to the p test via;

monitor an electrical response signal from the circuit card, wherein monitoring the electrical response signal comprises monitoring an n response signal from the n test via and monitoring a p response signal from the p test via;

determine a drilling depth of at least one of the master drills, in response to a comparison of the response signal to the query signal, wherein determining the drilling depth comprises:

measuring a stub length time skew between the n response signal and the p response signal; and determining a stub length offset between the n test via and the p test via, in response to the stub length time skew; and adjust operation of the gang drilling machine, in response to the drilling depth, wherein adjusting operation of the gang drilling machine comprises increasing the drilling depth of the at least one of the master drills and the plurality of associated minion drills, in response to the stub length offset.

2. The gang drilling machine of claim 1, wherein the controller is configured to;

increase the drilling depth of the n master drill and the plurality of n minion drills, in response to the stub length offset indicating that the n test via is longer than the p test via.

3. The gang drilling machine of claim 2, wherein the controller is configured to:

increase the drilling depth up to a maximum design value.

4. The gang drilling machine of claim 1, wherein the controller is configured to:

increase the drilling depth of the p master drill and the plurality of p minion drills, in response to the stub length offset indicating that the p test via is longer than the n test via.

5. The gang drilling machine of claim 4, wherein the controller is configured to:

increase the drilling depth up to a maximum design value.

6. The gang drilling machine of claim 1, further comprising the circuit card.

7. The gang drilling machine of claim 6, wherein the circuit card comprises:

a test coupon portion of the circuit card; and a live portion of the circuit card;

wherein the test coupon portion comprises:

the n test via;

the p test via; and n and p test ports that are electrically connected to the respective n and p test vias; and wherein the live portion comprises:

the plurality of live n vias; and the plurality of live p vias.

8. The gang drilling machine of claim 7, wherein the test coupon portion comprises a first test coupon portion and the circuit card further comprises a second test coupon portion that is laterally offset from the first test coupon portion, wherein the live portion is disposed laterally between the first test coupon portion and the second test coupon portion.

9. The gang drilling machine of claim 1, wherein the controller is further configured to:

stop the at least one of the master drills and the plurality of associated minion drills, in response to the drilling depth matching a reference plane depth.

10. The gang drilling machine of claim 9, wherein the controller is configured to:

determine that the drilling depth matches the reference plane depth based on the response signal matching the query signal.

11. The gang drilling machine of claim 1, wherein the controller is configured to:

increase the drilling depth of the at least one of the master drills and the plurality of associated minion drills, in response to the drilling depth being less than a reference plane depth.

12. The gang drilling machine of claim 11, wherein the controller is configured to:

determine that the drilling depth is less than the reference plane depth based on the response signal not matching the query signal.

13. The gang drilling machine of claim 1, wherein determining the stub length offset comprises searching a lookup table that relates the stub length time skew to the stub length offset.

* * * * *